US012795893B2

(12) United States Patent
Lim et al.

(10) Patent No.: US 12,795,893 B2
(45) Date of Patent: Nov. 10, 2026

(54) INTEGRATED CIRCUIT DEVICE

(71) Applicant: Samsung Electronics Co., Ltd., Suwon-si (KR)

(72) Inventors: Hanjin Lim, Suwon-si (KR); Jungmin Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 562 days.

(21) Appl. No.: 18/326,145

(22) Filed: May 31, 2023

(65) Prior Publication Data

US 2024/0090200 A1 Mar. 14, 2024

(30) Foreign Application Priority Data

Sep. 8, 2022 (KR) ........................ 10-2022-0114468

(51) Int. Cl.
*H10D 1/68* (2025.01)
*H10B 12/00* (2023.01)
*H01G 4/33* (2006.01)

(52) U.S. Cl.
CPC ........... *H10B 12/315* (2023.02); *H10B 12/34* (2023.02); *H10D 1/68* (2025.01); *H10D 1/692* (2025.01); *H10D 1/696* (2025.01); *H01G 4/33* (2013.01)

(58) Field of Classification Search
None
See application file for complete search history.

(56) References Cited

U.S. PATENT DOCUMENTS

| | | | | |
|---|---|---|---|---|
| 10,825,893 | B2 | 11/2020 | Cho et al. | |
| 10,847,721 | B2 | 11/2020 | Yoo | |
| 11,043,553 | B2 * | 6/2021 | Kim ..................... | H10B 12/033 |
| 11,171,145 | B2 | 11/2021 | Chang et al. | |
| 2003/0022454 | A1 | 1/2003 | Wang et al. | |

(Continued)

FOREIGN PATENT DOCUMENTS

| | | | |
|---|---|---|---|
| DE | 102022212078 | A1 | 5/2023 |
| JP | 2006032526 | A | 2/2006 |
| JP | 2014157917 | A | 8/2014 |

OTHER PUBLICATIONS

"Electronegativities of the elements (data page)" Retrieved on Nov. 30, 2023 from Wikipedia (Apr. 28, 2023).

(Continued)

*Primary Examiner* — William Henry Anderson
(74) *Attorney, Agent, or Firm* — Wolf, Greenfield & Sacks, P.C.

(57) ABSTRACT

An integrated circuit device includes a transistor on a substrate and a capacitor structure electrically connected to the transistor, wherein the capacitor structure includes a first electrode including a first conductive material having a first work function, a dielectric layer on the first electrode, the dielectric layer including first metal, a second electrode on the first electrode with the dielectric layer therebetween and including a second conductive material having a second work function that is less than the first work function, and an interfacial layer between the dielectric layer and the second electrode, where an electrical energy barrier between the second electrode and the dielectric layer is increased by the interfacial layer relative to that of a direct interface therebetween.

20 Claims, 21 Drawing Sheets

(56) References Cited

U.S. PATENT DOCUMENTS

| | | | | |
|---|---|---|---|---|
| 2004/0185653 | A1* | 9/2004 | Nagano | H10D 1/682 257/E21.648 |
| 2010/0172065 | A1 | 7/2010 | Huang et al. | |
| 2020/0091279 | A1* | 3/2020 | Moon | H10D 1/043 |
| 2020/0335333 | A1* | 10/2020 | Kang | C23C 16/405 |
| 2020/0357927 | A1* | 11/2020 | Hsieh | H10D 1/68 |
| 2021/0066446 | A1* | 3/2021 | Lee | H10D 1/688 |
| 2021/0183718 | A1* | 6/2021 | Lee | H10D 1/68 |
| 2021/0408115 | A1* | 12/2021 | Lin | H10B 61/22 |
| 2022/0069068 | A1 | 3/2022 | Lin et al. | |
| 2022/0130947 | A1 | 4/2022 | Lee et al. | |
| 2022/0140067 | A1 | 5/2022 | Song et al. | |
| 2023/0012093 | A1* | 1/2023 | Kakushima | G11C 11/2275 |
| 2023/0164977 | A1 | 5/2023 | Sung | |

OTHER PUBLICATIONS

Gregory et al. “Recommended values of clean metal surface work functions” Journal of Vacuum Science 33(6):060801 (Oct. 30, 2015).

* cited by examiner

B1 - B1'

INTEGRATED CIRCUIT DEVICE

CROSS-REFERENCE TO RELATED APPLICATION

This application is based on and claims priority under 35 U.S.C. § 119 to Korean Patent Application No. 10-2022-0114468, filed on Sep. 8, 2022, in the Korean Intellectual Property Office, the disclosure of which is incorporated by reference herein in its entirety.

FIELD

The inventive concept relates to an integrated circuit, and more particularly, to an integrated circuit device including a capacitor.

BACKGROUND

As electronics technology advances, semiconductor devices may be rapidly downscaled, and thus, patterns configuring electronic devices may be miniaturized. Based thereon, it may be desirable to reduce leakage current in capacitors having a fine size and to maintain desired electrical characteristics.

SUMMARY

The inventive concept provides an integrated circuit device including a capacitor structure, which may decrease a leakage current.

According to an aspect of the inventive concept, there is provided an integrated circuit device including a transistor on a substrate and a capacitor structure electrically connected to the transistor, wherein the capacitor structure includes a first electrode including a first conductive material having a first work function, a dielectric layer on the first electrode, the dielectric layer including a first metal, a second electrode on the first electrode with the dielectric layer therebetween, the second electrode including a second conductive material having a second work function that is less than the first work function, and an interfacial layer between the dielectric layer and the second electrode, where the interfacial layer increases an electrical energy barrier between the second electrode and the dielectric layer relative to that of a direct interface therebetween.

According to another aspect of the inventive concept, there is provided an integrated circuit device including a transistor on a substrate and a capacitor structure electrically connected to the transistor, wherein the capacitor structure includes a first electrode including a first conductive material having a first work function, a dielectric layer on the first electrode, the dielectric layer including first metal oxide including a first metal, a second electrode on the first electrode with the dielectric layer therebetween, the second electrode including a second conductive material having a second work function that is less than the first work function, and an interfacial layer between the dielectric layer and the second electrode, wherein the interfacial layer includes an insulating interfacial layer including a second metal, and a valence of the second metal of the insulating interfacial layer is less than a valence of the first metal of the dielectric layer.

According to another aspect of the inventive concept, there is provided an integrated circuit device including a word line in a word line trench extending in a first direction in a substrate, a contact structure on the substrate and electrically connected to the word line, and a capacitor structure on the contact structure and electrically connected to the contact structure, wherein the capacitor structure includes a first electrode including a first conductive material having a first work function, a dielectric layer on the first electrode, the dielectric layer including a first metal oxide including a first metal, a second electrode on the first electrode with the dielectric layer therebetween and including a second conductive material having a second work function that is less than the first work function, and an interfacial layer between the dielectric layer and the second electrode, the first metal comprises zirconium (Zr), hafnium (Hf), titanium (Ti), or tantalum (Ta), the interfacial layer includes an insulating interfacial layer including a second metal, a valence of the second metal being less than a valence of the first metal of the dielectric layer and a first conductive interfacial layer including a third metal, an electronegativity of the third metal being greater than an electronegativity of the first metal of the dielectric layer, the insulating interfacial layer and the first conductive interfacial layer are stacked in a vertical direction perpendicular to a surface of the second electrode, between the dielectric layer and the second electrode, wherein the interfacial layer is increases an electrical energy barrier between the second electrode and the dielectric layer relative to that of a direct interface therebetween.

BRIEF DESCRIPTION OF THE DRAWINGS

Embodiments will be more clearly understood from the following detailed description taken in conjunction with the accompanying drawings in which.

DETAILED DESCRIPTION OF EMBODIMENTS

Figure 1:
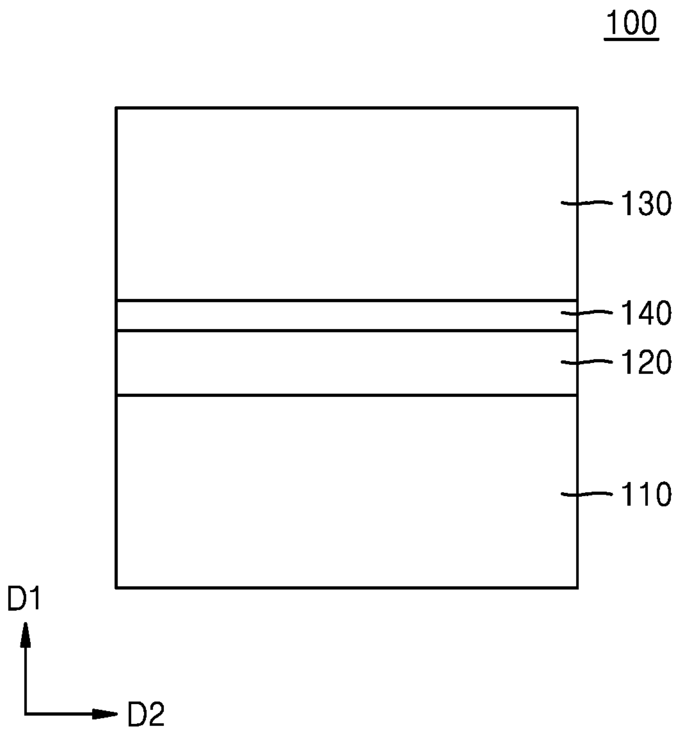
FIG. 1 is a cross-sectional view illustrating a capacitor structure of an integrated circuit device according to embodiments.

Hereinafter, various embodiments will be described in detail with reference to the accompanying drawings. Like reference numerals refer to like elements in the drawings, and their repeated descriptions are omitted. The terms "comprises," "comprising," "includes" and/or "including," when used herein, specify the presence of stated elements, but do not preclude the presence of additional elements. The term "and/or" includes any and all combinations of one or more of the associated listed items.

FIG. 1 is a cross-sectional view illustrating a capacitor structure 100 of an integrated circuit device according to embodiments.

Referring to FIG. 1, the integrated circuit device according to embodiments may include a capacitor structure 100 formed on a substrate.

The substrate may include a semiconductor, such as silicon (Si) or germanium (Ge), or a compound semiconductor such as SiC, GaAs, InAs, and InP. The substrate may include structures which each include a semiconductor substrate and at least one conductive region or at least one insulation layer formed on the semiconductor substrate. The conductive region may include, for example, an impurity-doped well or an impurity-doped structure. In embodiments, the substrate may have various device isolation structures such as a shallow trench isolation (STI) structure.

The capacitor structure 100 may be disposed on the substrate and may be electrically connected to a transistor formed on and/or in the substrate. The capacitor structure 100 may include a first electrode 110, a dielectric layer 120, an interfacial layer 140, and a second electrode 130, which are sequentially stacked in a first direction D1. The first direction D1 may be defined as a direction vertical or normal to one surface of the second electrode 130 facing the dielectric layer 120, and a second direction D2 may be defined as a direction parallel to the one surface of the second electrode 130 facing the dielectric layer 120. The terms "first," "second," "third," etc., may be used herein merely to distinguish one element, layer, direction, etc., from another. Elements referred to herein as "connected to" may be electrically and/or physically connected.

The first electrode 110 and the second electrode 130 may face each other with the dielectric layer 120 and the interfacial layer 140 therebetween. In embodiments, the first electrode 110 and the second electrode 130 may be respectively referred to as a lower electrode and an upper electrode.

Each of the first electrode 110 and the second electrode 130 may include a metal-containing film or doped polysilicon. Each of the first electrode 110 and the second electrode 130 may include a metal film, a conductive metal oxide film, a conductive metal nitride film, a conductive metal oxynitride film, or a combination thereof. In embodiments, each of the first electrode 110 and the second electrode 130 may include metal such as titanium (Ti), niobium (Nb), cobalt (Co), tin (Sn), ruthenium (Ru), or tungsten (W), nitride including the metal, or oxide including the metal. In embodiments, each of the first electrode 110 and the second electrode 130 may include NbN, TiN, TaN, CoN, $SnO_2$, or a combination thereof. In embodiments, each of the first electrode 110 and the second electrode 130 may include TaN, TiAlN, TaAlN, W, Ru, $RuO_2$, $SrRuO_3$, Ir, $IrO_2$, Pt, PtO, SRO($SrRuO_3$), BSRO((Ba,Sr)$RuO_3$), CRO($CaRuO_3$), LSCO((La,Sr)$CoO_3$), or a combination thereof. However, a material of the first electrode 110 and a material of the second electrode 130 are not limited to the embodiments described above. In some embodiments, each of the first electrode 110 and the second electrode 130 may include a single layer or a multi-layer structure.

In some embodiments, the first electrode 110 may include a first conductive material having a first work function, and the second electrode 130 may include a second conductive material having a second work function which is less than the first work function. The first conductive material may differ from the second conductive material. In embodiments, the first work function may be determined to be a value which is greater than a predetermined reference work function, and the second work function may be determined to be a value which is less than the reference work function. In embodiments, the reference work function may be one value selected from among about 4.0 eV to about 5.5 eV, one value selected from among 4.2 eV to 5.3 eV, or one value selected from among 4.5 eV to 5.0 eV. In embodiments, the first conductive material of the first electrode 110 may include precious metal (for example, platinum (Pt), iridium (Ir), etc.), and the second conductive material of the second electrode 130 may include Ti, tantalum (Ta), Nb, or W.

The dielectric layer 120 may include a high-k dielectric film. The term "high-k dielectric film" described herein may be defined as a dielectric film having a dielectric constant which is higher than that of a silicon oxide film. In embodiments, the dielectric layer 120 may include first metal oxide including first metal. The first metal may include at least one material selected from among hafnium (Hf), zirconium (Zr), aluminum (Al), niobium (Nb), cerium (Ce), lanthanum (La), tantalum (Ta), titanium (Ti), strontium (Sr), and barium (Ba). In embodiments, the first metal oxide included in the dielectric layer 120 may include $HfO_2$, $ZrO_2$, $Al_2O_3$, $La_2O_3$, $Ta_2O_5$, $TiO_2$, $SrTiO_3$, $BaSrTiO_3$, $Nb_2O_5$, $CeO_2$, or a combination thereof, but is not limited thereto. The dielectric layer 120 may have a single-layer structure including one high-k dielectric film, or may have a multi-layer structure including a plurality of high-k dielectric films.

The interfacial layer 140 may be disposed between the dielectric layer 120 and the second electrode 130. The interfacial layer 140 may be inserted between the dielectric layer 120 and the second electrode 130, and may be configured to increase an electrical energy barrier between the dielectric layer 120 and the second electrode 130. The interfacial layer 140 may include an insulating interfacial film, a conductive interfacial film, or a combination thereof. For example, a thickness of the interfacial layer 140 may be within a range of about 1 Å to about 30 Å, 1 Å to 25 Å, 1 Å to 20 Å, 1 Å to 15 Å, 1 Å to 10 Å, or 1 Å to 5 Å in the first direction D1.

Figure 2A:
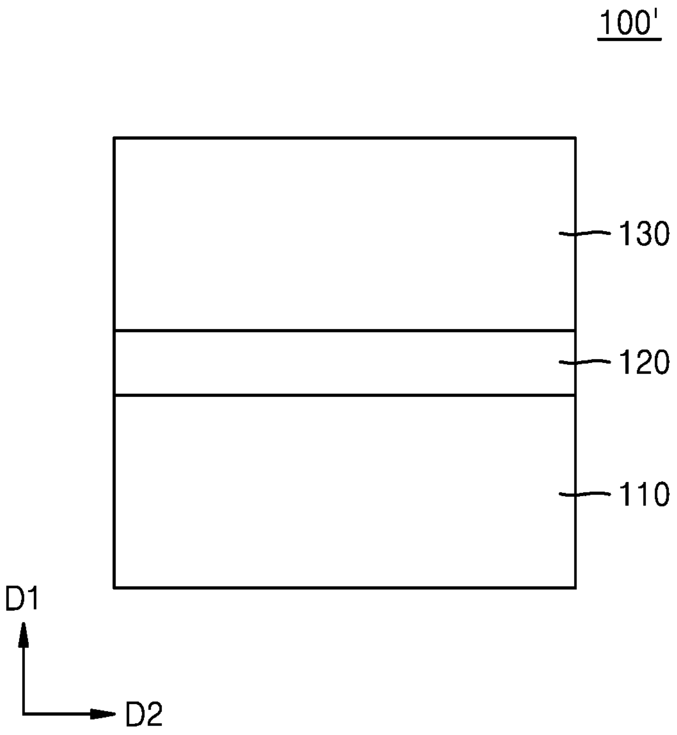
FIG. 2A is a cross-sectional view illustrating a capacitor structure of an integrated circuit device according to a comparative example.
Figure 2B:
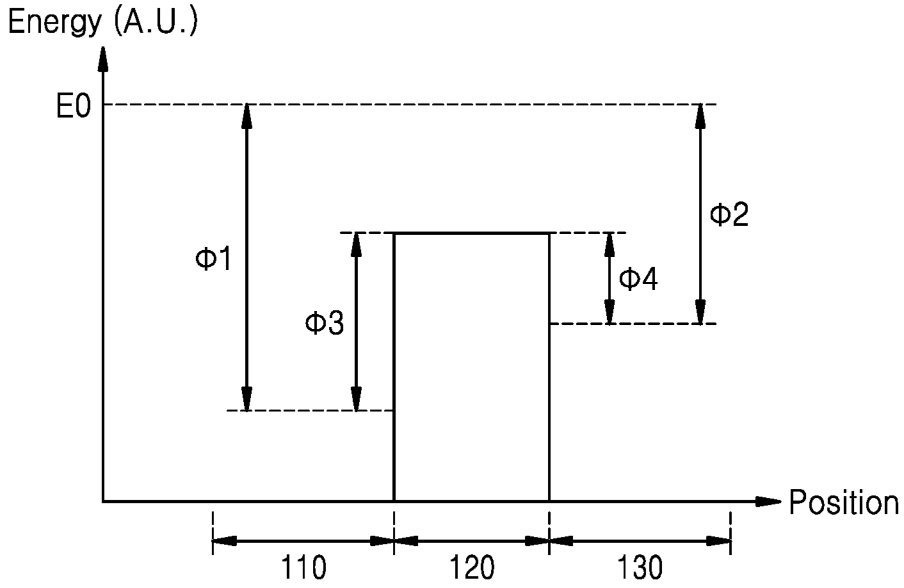
FIG. 2B is an energy band diagram of the capacitor structure of FIG. 2A.
Figure 2C:
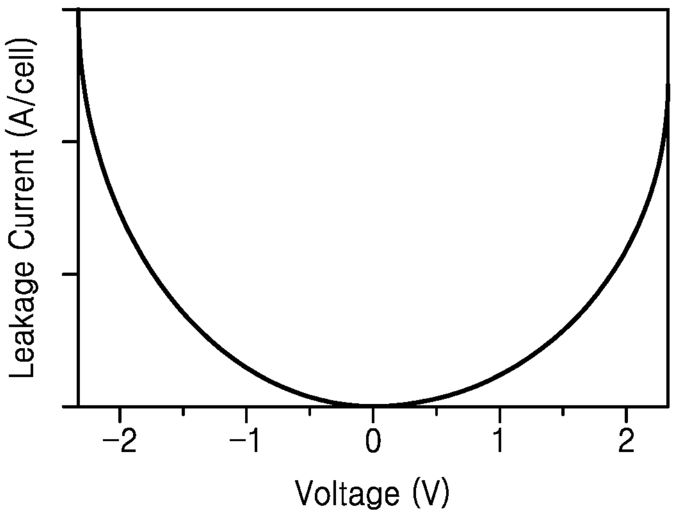
FIG. 2C is a graph showing the I-V characteristic representing a behavior of a leakage current with respect to an applied voltage, in the capacitor structure of FIG. 2A.

FIG. 2A is a cross-sectional view illustrating a capacitor structure 100' of an integrated circuit device according to a comparative example. FIG. 2B is an energy band diagram of the capacitor structure 100' of FIG. 2A. FIG. 2C is a graph showing the I-V characteristic representing a behavior of a leakage current with respect to an applied voltage, in the capacitor structure 100' of FIG. 2A.

Referring to FIGS. 2A to 2C, the capacitor structure 100' according to the comparative example may include a first electrode 110, a second dielectric layer 120, and a second electrode 130, which are sequentially stacked in a first direction D1. The capacitor structure 100' according to the comparative example may not include the interfacial layer, and the second electrode 130 may contact the dielectric layer 120.

The first electrode 110 may include a first conductive material having a first work function Φ1, and the second electrode 130 may include a second conductive material having a second work function Φ2. The first work function Φ1 may correspond to a difference between a vacuum energy level E1 and a fermi level of the first conductive material, and the second work function Φ2 may correspond to a difference between the vacuum energy level E0 and the fermi level of the first conductive material. Because the first work function Φ1 is greater than the second work function Φ2, a first electrical energy barrier Φ3 formed between the first electrode 110 and the dielectric layer 120 may be greater than a second electrical energy barrier Φ4 formed between the second electrode 130 and the dielectric layer 120. When the second electrical energy barrier Φ4 formed between the second electrode 130 and the dielectric layer 120 is less than the first electrical energy barrier Φ3 formed between the first electrode 110 and the dielectric layer 120, a higher leakage current may occur in the second electrode 130 where an electrical energy barrier is relatively small, while an external voltage is being applied to the capacitor structure 100'. In this case, as shown in FIG. 2C, the I-V characteristic representing a behavior of a leakage current based on an external voltage applied to the capacitor structure 100' may be asymmetrical. That is, a leakage current when a voltage having a positive value (i.e., a voltage which is higher than 0 V) is applied to the capacitor structure 100' and a leakage current when a voltage having a negative value (i.e., a voltage which is lower than 0 V) is applied to the capacitor structure 100' may be asymmetrically shown. When the I-V characteristic is asymmetrical, a higher leakage current may occur in one direction of application of the external voltage to the capacitor structure 100', and the amount of electric charge lost in the capacitor structure 100' may increase, causing a problem where the reliability of the capacitor structure 100' is reduced.

Figure 3:
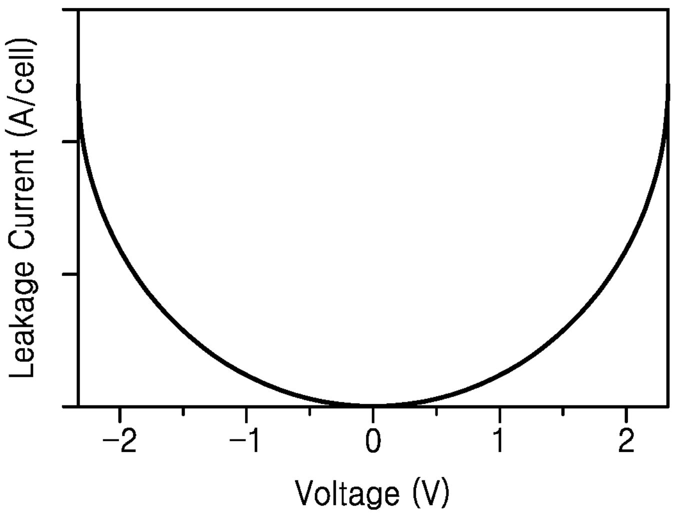
FIG. 3 is a graph showing the I-V characteristic representing a behavior of a leakage current with respect to an applied voltage in a capacitor structure according to embodiments.

FIG. 3 is a graph showing the I-V characteristic representing a behavior of a leakage current with respect to an applied voltage in a capacitor structure according to embodiments.

Referring to FIGS. 1 and 3, the interfacial layer 140 may be inserted between the dielectric layer 120 and the second electrode 130, and an electrical energy barrier between the dielectric layer 120 and the second electrode 130 may be increased by the interfacial layer 140. In embodiments, the electrical energy barrier formed between the dielectric layer 120 and the second electrode 130 may be increased to a level which is substantially the same as (i.e., the same as or similar to) a first electrical energy barrier (Φ3 of FIG. 2B) formed between the first electrode 110 and the dielectric layer 120, based on the interfacial layer 140. That is, the interfacial layer 140 is configured to increase the electrical energy barrier between the second electrode 130 and the dielectric layer 120 so as to be substantially the same as an electrical energy barrier between the first electrode 110 and the dielectric layer 120. In embodiments, the interfacial layer 140 inserted between the dielectric layer 120 and the second electrode 130 may act based on a p-type doping effect, and thus, an electrical energy barrier between the dielectric layer 120 and the second electrode 130 may be increased. In embodiments, the electrical energy barrier between the dielectric layer 120 and the second electrode 130 may be increased based on polarization formed by the interfacial layer 140 inserted between the dielectric layer 120 and the second electrode 130. As shown in FIG. 3, in the capacitor structure 100 including the first and second electrodes 110 and 130 having different work functions, as the electrical energy barrier between the dielectric layer 120 and the second electrode 130 is increased by the interfacial layer 140, the I-V characteristic representing a behavior of a leakage current based on an external voltage applied to the capacitor structure 100 may be symmetrical or may have substantial symmetry (also referred to herein as substantially symmetrical, which need not have exact symmetry). When the capacitor structure 100 has a symmetrical I-V characteristic, a leakage current based on an external voltage applied to the capacitor structure 100 may symmetrically occur in both directions of the external voltage, and in this case, the loss of an electric charge from the capacitor structure 100 may be reduced or prevented, thereby improving the reliability of the capacitor structure 100.

Figure 4A:
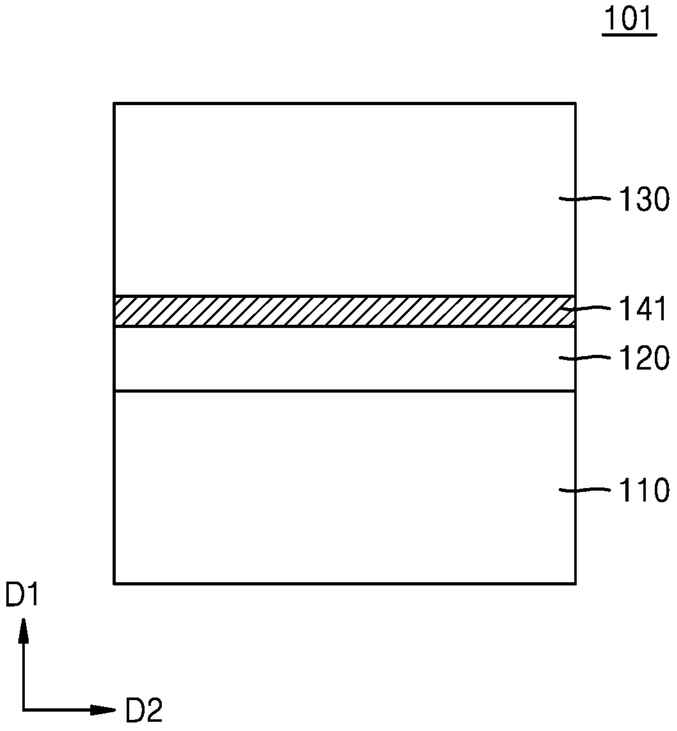
FIG. 4A is a cross-sectional view illustrating a capacitor structure of an integrated circuit device according to embodiments.
Figure 4B:
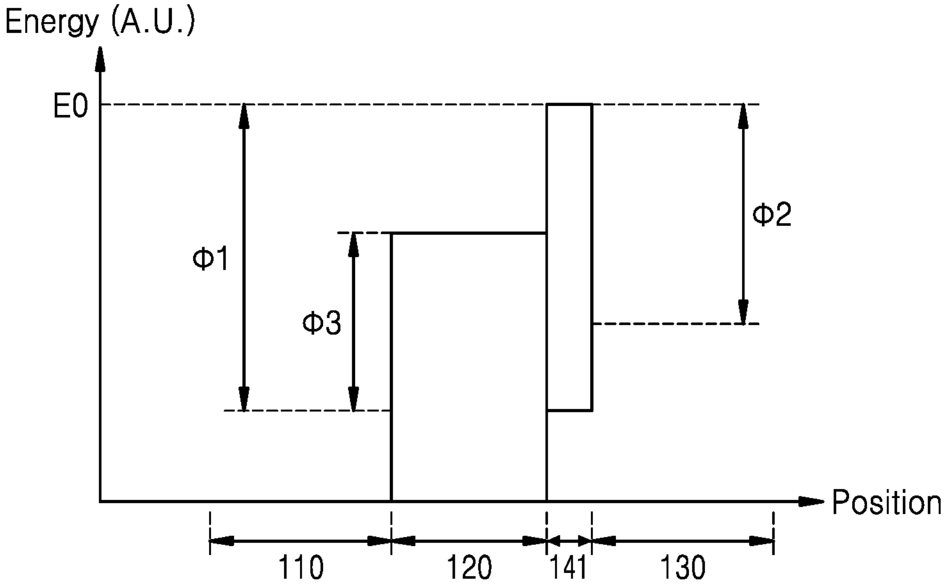
FIG. 4B is a diagram showing an energy band diagram with respect to an applied voltage, in the capacitor structure of FIG. 4A.

FIG. 4A is a cross-sectional view illustrating a capacitor structure 101 of an integrated circuit device according to embodiments. FIG. 4B is a diagram showing an energy band diagram with respect to an applied voltage, in the capacitor structure 101 of FIG. 4A.

Referring to FIGS. 4A and 4B, the capacitor structure 101 may include a first electrode 110, a dielectric layer 120, an insulating interfacial layer 141, and a second electrode 130, which are sequentially stacked in a first direction D1.

The insulating interfacial layer 141 may include an insulation material including a second metal, which may be different than the first metal of the dielectric layer 120. In embodiments, the insulating interfacial layer 141 may include a metal oxide including the second metal.

In embodiments, a valence of the second metal included in the insulating interfacial layer 141 may be less than that of the first metal included in the dielectric layer 120. In embodiments, when the first metal included in the dielectric layer 120 has a valence of +4 or more, the second metal included in the insulating interfacial layer 141 may have a valence of +3 or less. In embodiments, when the first metal included in the dielectric layer 120 has a valence of +3 or more, the second metal included in the insulating interfacial layer 141 may have a valence of +3 or less. In embodiments, the first metal included in the dielectric layer 120 may be selected from among Zr, Hf, Ti, and Ta, and the second metal included in the insulating interfacial layer 141 may be selected from rare-earth metals (for example, lanthanum (La) and yttrium (Yt)). In embodiments, the dielectric layer 120 may include $HfO_2$, $ZrO_2$, $TiO_2$, $Ta_2O_3$, or a combination thereof, and the insulating interfacial layer 141 may include $La_2O_3$, $Y_2O_3$, or a combination thereof.

In embodiments, a thickness of the insulating interfacial layer 141 in the first direction D1 may be 5 Å or less. In embodiments, a thickness of the insulating interfacial layer 141 in the first direction D1 may be within a range of 1 Å to 5 Å.

When the insulating interfacial layer 141 inserted between the second electrode 130 and the dielectric layer 120 includes the second metal having a valence which is less than that of the first metal included in the dielectric layer 120, the insulating interfacial layer 141 may act based on the p-type doping effect, and thus, an electrical energy barrier formed between the second electrode 130 and the dielectric layer 120 may be increased. Accordingly, the electrical energy barrier formed between the second electrode 130 and the dielectric layer 120 maybe increased by the insulating interfacial layer 141, and the capacitor structure 101 including the first and second electrodes 110 and 130 having different work functions may have a symmetrical I-V characteristic.

Figure 5A:
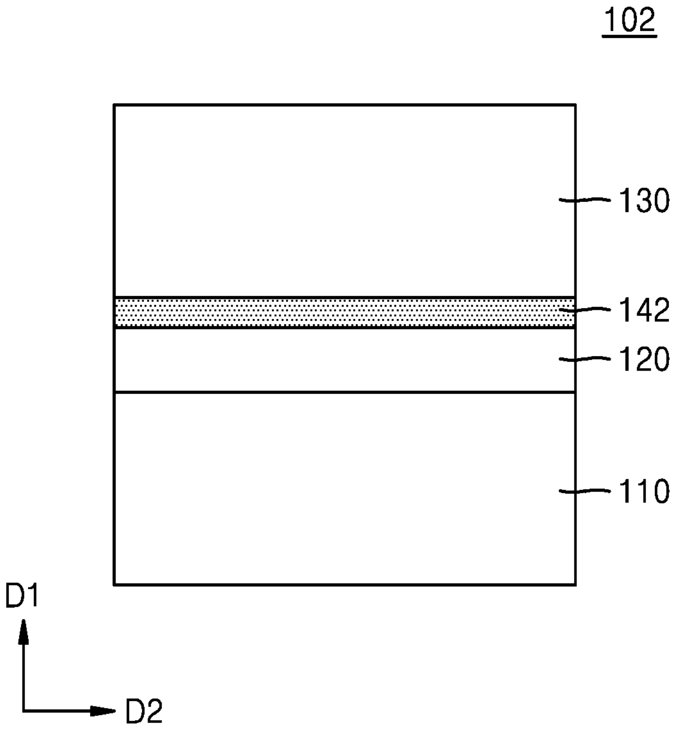
FIG. 5A is a cross-sectional view illustrating a capacitor structure of an integrated circuit device according to embodiments.
Figure 5B:
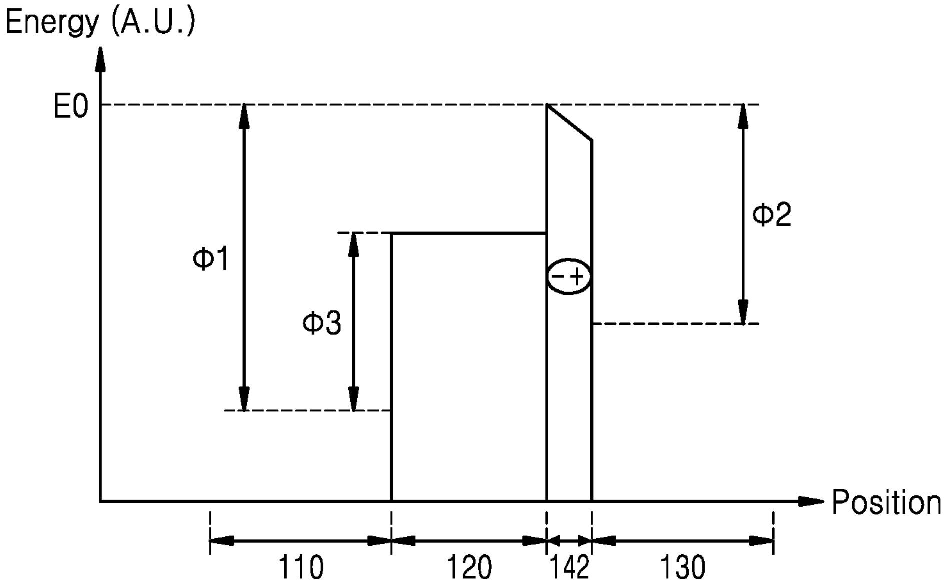
FIG. 5B is a diagram showing an energy band diagram with respect to an applied voltage, in the capacitor structure of FIG. 5A.

FIG. 5A is a cross-sectional view illustrating a capacitor structure 102 of an integrated circuit device according to embodiments. FIG. 5B is a diagram showing an energy band diagram with respect to an applied voltage, in the capacitor structure 102 of FIG. 5A.

Referring to FIGS. 5A and 5B, the capacitor structure 102 may include a first electrode 110, a dielectric layer 120, a first conductive interfacial layer 142, and a second electrode 130, which are sequentially stacked in a first direction D1.

The first conductive interfacial layer 142 may include a conductive material including third metal. In embodiments, the first conductive interfacial layer 142 may include a third metal, conductive nitride including the third metal, conductive oxide including the third metal, conductive oxynitride including the third metal, or a combination thereof.

In embodiments, an electronegativity of the third metal included in the first conductive interfacial layer 142 may be greater than that of the first metal included in the dielectric layer 120. In embodiments, an electronegativity of the third metal may be determined to be a value which is greater than predetermined reference electronegativity, and an electronegativity of the first metal may be determined to be a value which is less than the reference electronegativity. An electronegativity of the first metal, an electronegativity of the third metal, and the reference electronegativity may be defined by a Pauling electronegativity criterion. In embodiments, the reference electronegativity may be one value selected from among 1.0 to 2.0, one value selected from among 1.1 to 1.9, one value selected from among 1.2 to 1.8, or one value selected from among 1.3 to 1.7. The first metal included in the dielectric layer 120 may be selected from among Zr, Hf, Ti, Ta, Sr, barium (Ba), and Al, and the third metal included in the first conductive interfacial layer 142 may be selected from among chromium (Cr), molybdenum (Mo), W, Ru, Co, Ir, nickel (Ni), platinum (Pt), copper (Cu), silver (Ag), gold (Au), and Sn.

In embodiments, a thickness of the first conductive interfacial layer 142 in the first direction D1 may be 10 Å or less. In embodiments, a thickness of the first conductive interfacial layer 142 in the first direction D1 may be within a range of 1 Å to 10 Å.

When the first conductive interfacial layer 142 inserted between the second electrode 130 and the dielectric layer 120 includes third metal having electronegativity which is greater than that of the first metal included in the dielectric layer 120, an electrical energy barrier formed between the second electrode 130 and the dielectric layer 120 may be increased by polarization formed by the first conductive interfacial layer 142. Accordingly, the capacitor structure 102 including the first and second electrodes 110 and 130 having different work functions may have a symmetrical I-V characteristic.

Figure 6:
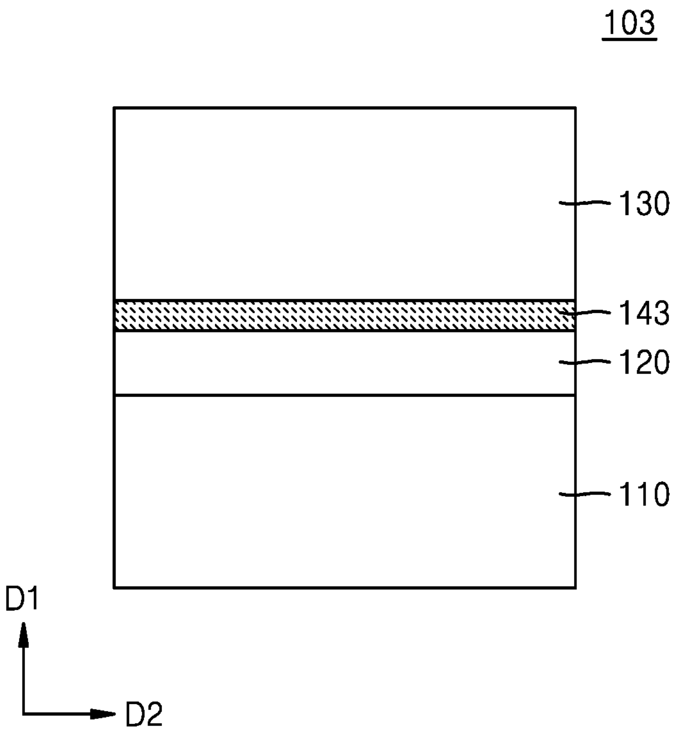
FIG. 6 is a cross-sectional view illustrating a capacitor structure of an integrated circuit device according to embodiments.

FIG. 6 is a cross-sectional view illustrating a capacitor structure 103 of an integrated circuit device according to embodiments.

Referring to FIG. 6, the capacitor structure 103 may include a first electrode 110, a dielectric layer 120, a second conductive interfacial layer 143, and a second electrode 130, which are sequentially stacked in a first direction D1.

The second conductive interfacial layer 143 may include a conductive material including a fourth metal. In embodiments, the second conductive interfacial layer 143 may include a second metal oxide including the fourth metal.

In embodiments, an oxygen chemical potential of the second metal oxide included in the second conductive interfacial layer 143 may be greater than that of first metal oxide included in the dielectric layer 120. In embodiments, the first metal oxide of the dielectric layer 120 may include $HfO_2$, $ZrO_2$, $Al_2O_3$, $Ta_2O_5$, $TiO_2$, $SrTiO_3$, $BaSrTiO_3$, or a combination thereof, and the second metal oxide of the second conductive interfacial layer 143 may include Mo oxide, W oxide, Ru oxide, Ir oxide, Pt oxide, Sn oxide, or a combination thereof.

In embodiments, a thickness of the second conductive interfacial layer 143 in the first direction D1 may be 10 Å or less. In embodiments, a thickness of the second conductive interfacial layer 143 in the first direction D1 may be within a range of 1 Å to 10 Å.

When an oxygen chemical potential of second metal oxide included in the second conductive interfacial layer 143 inserted between the second electrode 130 and the dielectric layer 120 is greater than that of the first metal oxide included in the dielectric layer 120, an electrical energy barrier formed between the second electrode 130 and the dielectric layer 120 may be increased by polarization formed by the second conductive interfacial layer 143. Accordingly, the capacitor structure 103 including the first and second electrodes 110 and 130 having different work functions may have a symmetrical I-V characteristic.

Figure 7:
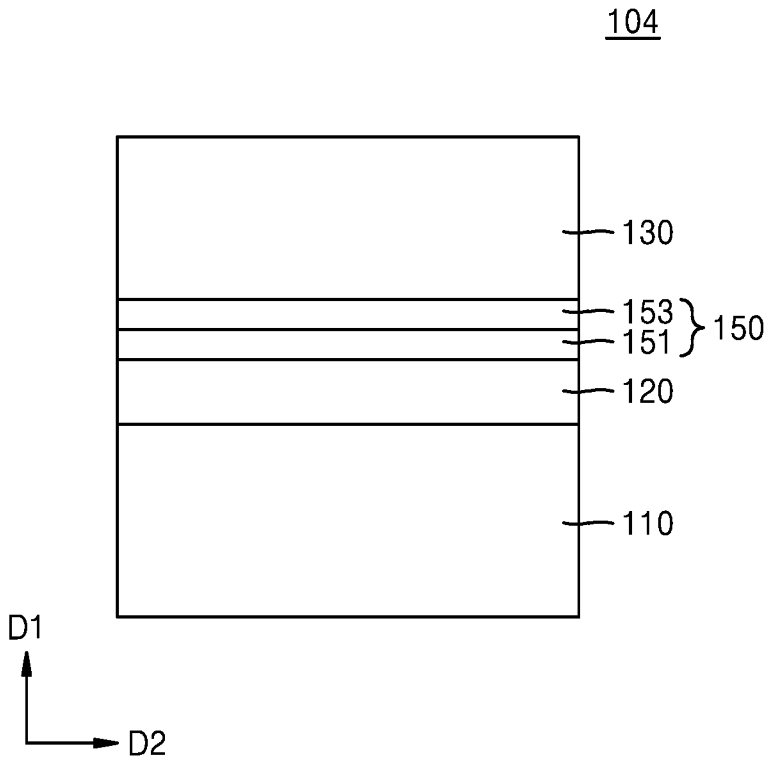
FIG. 7 is a cross-sectional view illustrating a capacitor structure of an integrated circuit device according to embodiments.

FIG. 7 is a cross-sectional view illustrating a capacitor structure 104 of an integrated circuit device according to embodiments.

Referring to FIG. 7, the capacitor structure 104 may include a first electrode 110, a dielectric layer 120, an interfacial layer 150, and a second electrode 130, which are sequentially stacked in a first direction D1, and the interfacial layer 150 may include a first interfacial layer 151 and a second interfacial layer 153, which are stacked in the first direction D1. The first interfacial layer 151 may contact the dielectric layer 120, and the second interfacial layer 153 may contact the second electrode 130.

The first interfacial layer 151 may correspond to one of the insulating interfacial layer 141 described above with reference to FIGS. 4A and 4B, the first conductive interfacial layer 142 described above with reference to FIGS. 5A and 5B, and the second conductive interfacial layer 143 described above with reference to FIG. 6. The second interfacial layer 153 may correspond to one of the insulating interfacial layer 141 described above with reference to FIGS. 4A and 4B, the first conductive interfacial layer 142 described above with reference to FIGS. 5A and 5B, and the second conductive interfacial layer 143 described above with reference to FIG. 6.

Figure 8:
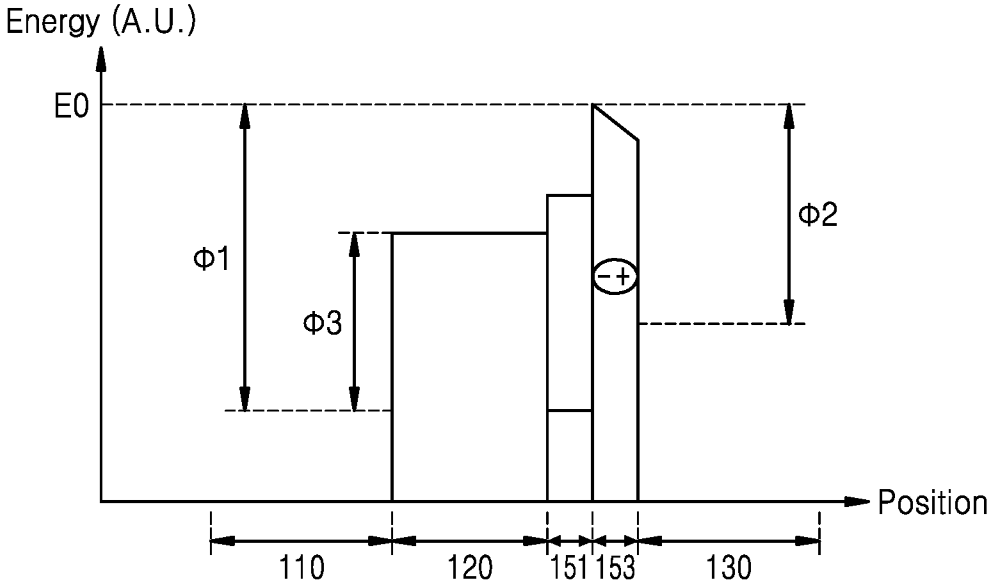
FIG. 8 is a diagram showing an energy band diagram with respect to an applied voltage, in a capacitor structure according to embodiments.

FIG. 8 is a diagram showing an energy band diagram with respect to an applied voltage, in a capacitor structure 104 according to embodiments.

Referring to FIGS. 7 and 8, in the capacitor structure 104, a first interfacial layer 151 may correspond to the insulating interfacial layer 141 described above with reference to FIGS. 4A and 4B, and a second interfacial layer 153 may correspond to one of the first conductive interfacial layer 142 described above with reference to FIGS. 5A and 5B and the second conductive interfacial layer 143 described above with reference to FIG. 6. An electrical energy barrier formed between the second electrode 130 and the dielectric layer 120 may be increased by the first interfacial layer 151 and the second interfacial layer 153, and the capacitor structure 104 including the first and second electrodes 110 and 130 having different work functions may have a symmetrical I-V characteristic.

Figure 9:
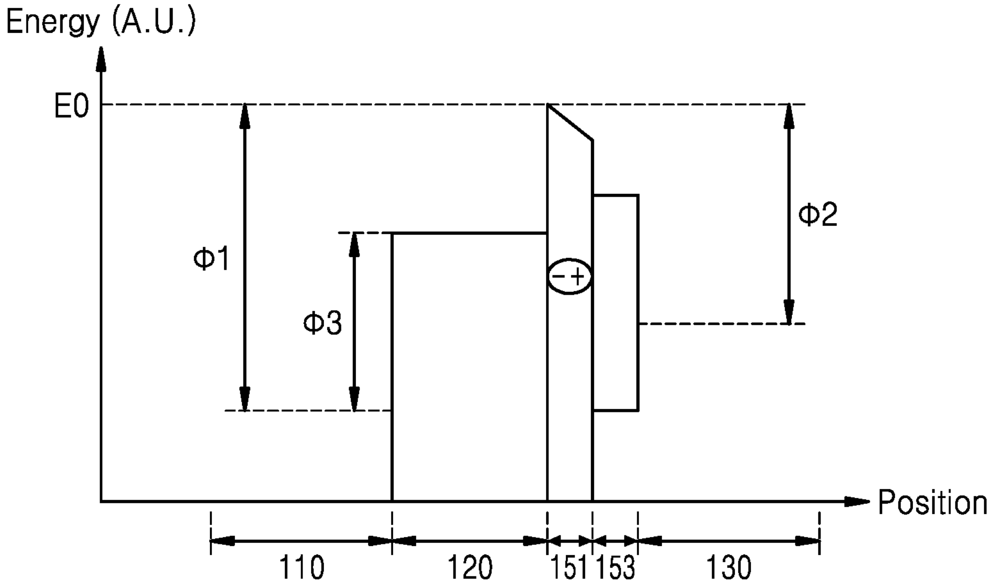
FIG. 9 is a diagram showing an energy band diagram with respect to an applied voltage, in a capacitor structure according to embodiments.

FIG. 9 is a diagram showing an energy band diagram with respect to an applied voltage, in a capacitor structure 104 according to embodiments.

Referring to FIGS. 7 and 9, in the capacitor structure 104, a first interfacial layer 151 may correspond to one of the first conductive interfacial layer 142 described above with reference to FIGS. 5A and 5B and the second conductive interfacial layer 143 described above with reference to FIG. 6, and a second interfacial layer 153 may correspond to the insulating interfacial layer 141 described above with reference to FIGS. 4A and 4B. An electrical energy barrier formed between the second electrode 130 and the dielectric layer 120 may be increased by the first interfacial layer 151 and the second interfacial layer 153, and the capacitor structure 104 including the first and second electrodes 110 and 130 having different work functions may have a symmetrical I-V characteristic.

Figure 10:
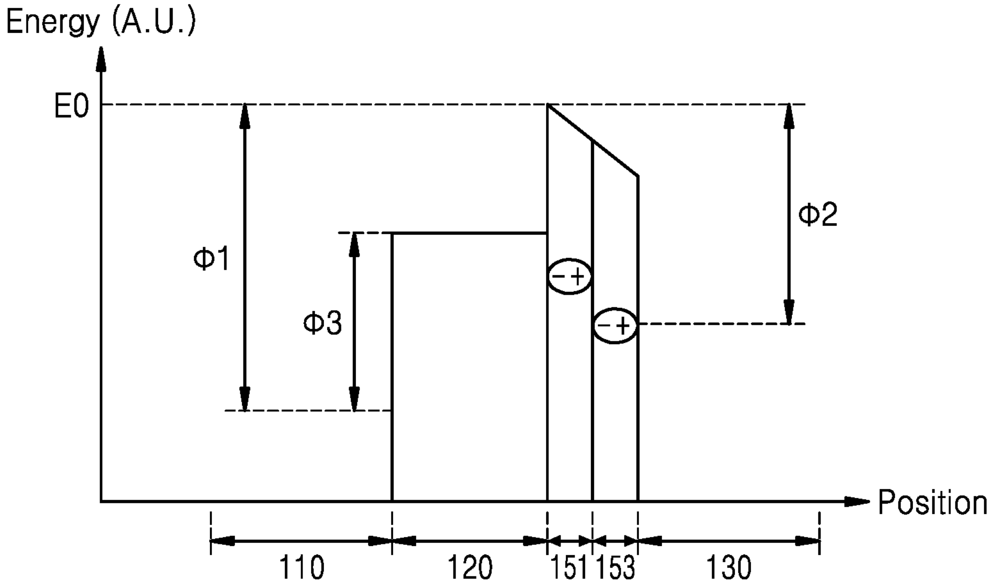
FIG. 10 is a diagram showing an energy band diagram with respect to an applied voltage, in a capacitor structure according to embodiments.

FIG. 10 is a diagram showing an energy band diagram with respect to an applied voltage, in a capacitor structure 104 according to embodiments.

Referring to FIGS. 7 and 10, in the capacitor structure 104, one of a first interfacial layer 151 and a second interfacial layer 153 may correspond to one of the first conductive interfacial layers 142 described above with reference to FIGS. 5A and 5B, and other one of the first interfacial layer 151 and the second interfacial layer 153 may correspond to the second conductive interfacial layer 143 described above with reference to FIG. 6. An electrical energy barrier formed between the second electrode 130 and the dielectric layer 120 may be increased by the first interfacial layer 151 and the second interfacial layer 153, and the capacitor structure 104 including the first and second electrodes 110 and 130 having different work functions may have a symmetrical I-V characteristic.

Figure 11:
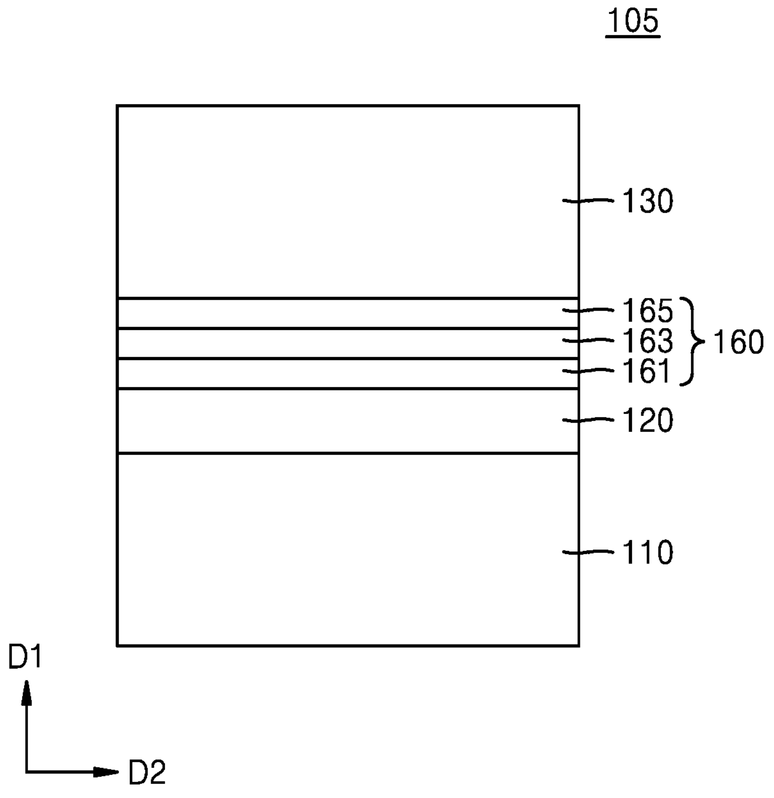
FIG. 11 is a cross-sectional view illustrating a capacitor structure of an integrated circuit device according to embodiments.

FIG. 11 is a cross-sectional view illustrating a capacitor structure 105 of an integrated circuit device according to embodiments.

Referring to FIG. 11, the capacitor structure 105 may include a first electrode 110, a dielectric layer 120, an interfacial layer 160, and a second electrode 130, which are sequentially stacked in a first direction D1, and the interfacial layer 160 may include a first interfacial layer 161, a second interfacial layer 163, and a third interfacial layer 165, which are stacked in the first direction D1. The first interfacial layer 161 may contact the dielectric layer 120, the third interfacial layer 165 may contact the second electrode 130, and the second interfacial layer 163 may be disposed between the first interfacial layer 161 and the third interfacial layer 165.

The first interfacial layer 161 may correspond to one of the insulating interfacial layer 141 described above with reference to FIGS. 4A and 4B, the first conductive interfacial layer 142 described above with reference to FIGS. 5A and 5B, and the second conductive interfacial layer 143 described above with reference to FIG. 6. The second interfacial layer 163 may correspond to one of the insulating interfacial layer 141 described above with reference to FIGS. 4A and 4B, the first conductive interfacial layer 142 described above with reference to FIGS. 5A and 5B, and the second conductive interfacial layer 143 described above with reference to FIG. 6. The third interfacial layer 165 may correspond to one of the insulating interfacial layer 141 described above with reference to FIGS. 4A and 4B, the first conductive interfacial layer 142 described above with reference to FIGS. 5A and 5B, and the second conductive interfacial layer 143 described above with reference to FIG. 6.

Figure 12:
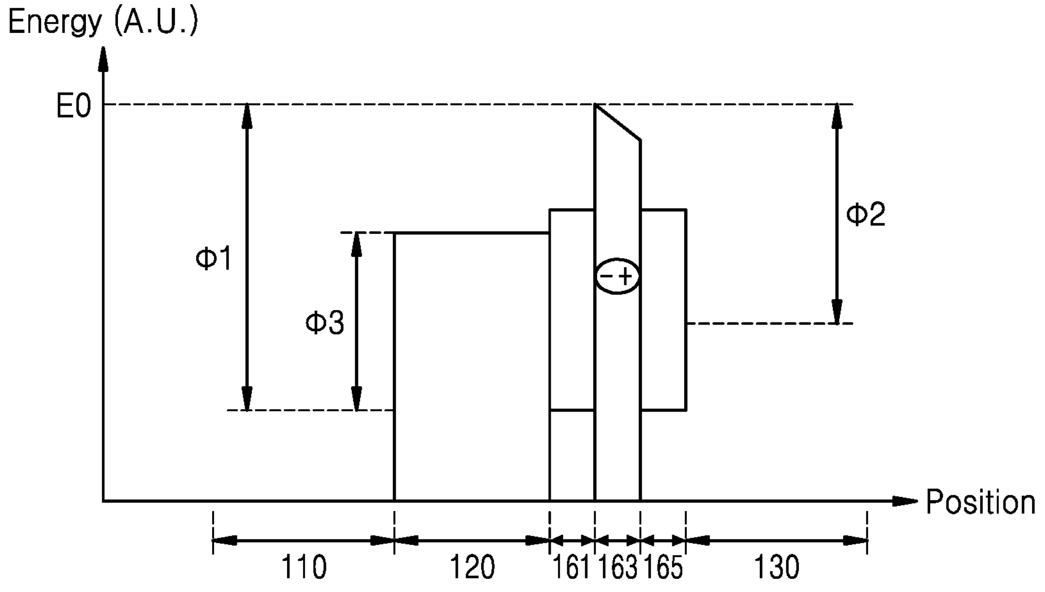
FIG. 12 is a diagram showing an energy band diagram with respect to an applied voltage, in a capacitor structure according to embodiments.

FIG. 12 is a diagram showing an energy band diagram with respect to an applied voltage, in a capacitor structure 105 according to embodiments.

Referring to FIGS. 11 and 12, in the capacitor structure 105, each of a first interfacial layer 161 and a third interfacial layer 165 may correspond to the insulating interfacial layer 141 described above with reference to FIGS. 4A and 4B, and a second interfacial layer 163 may correspond to one of the first conductive interfacial layer 142 described above with reference to FIGS. 5A and 5B and the second conductive interfacial layer 143 described above with reference to FIG. 6. An electrical energy barrier formed between the second electrode 130 and the dielectric layer 120 may be increased by the based on the interfacial layer 160, and the capacitor structure 105 including the first and second electrodes 110 and 130 having different work functions may have a symmetrical I-V characteristic.

Figure 13:
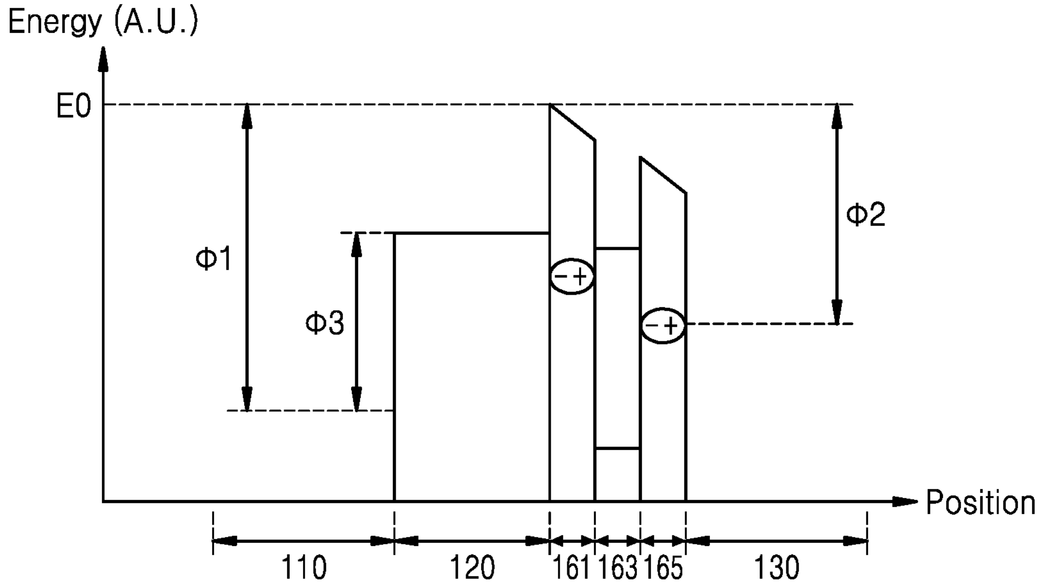
FIG. 13 is a diagram showing an energy band diagram with respect to an applied voltage, in a capacitor structure according to embodiments.

FIG. 13 is a diagram showing an energy band diagram with respect to an applied voltage, in a capacitor structure 105 according to embodiments.

Referring to FIGS. 11 and 13, in the capacitor structure 105, each of a first interfacial layer 161 and a third interfacial layer 165 may correspond to one of the first conductive interfacial layer 142 described above with reference to FIGS. 5A and 5B and the second conductive interfacial layer 143 described above with reference to FIG. 6, and a second interfacial layer 163 may correspond to the insulating interfacial layer 141 described above with reference to FIGS. 4A and 4B. An electrical energy barrier formed between the second electrode 130 and the dielectric layer 120 may be increased by the interfacial layer 160, and the capacitor structure 105 including the first and second electrodes 110 and 130 having different work functions may have a symmetrical I-V characteristic.

Figure 14:
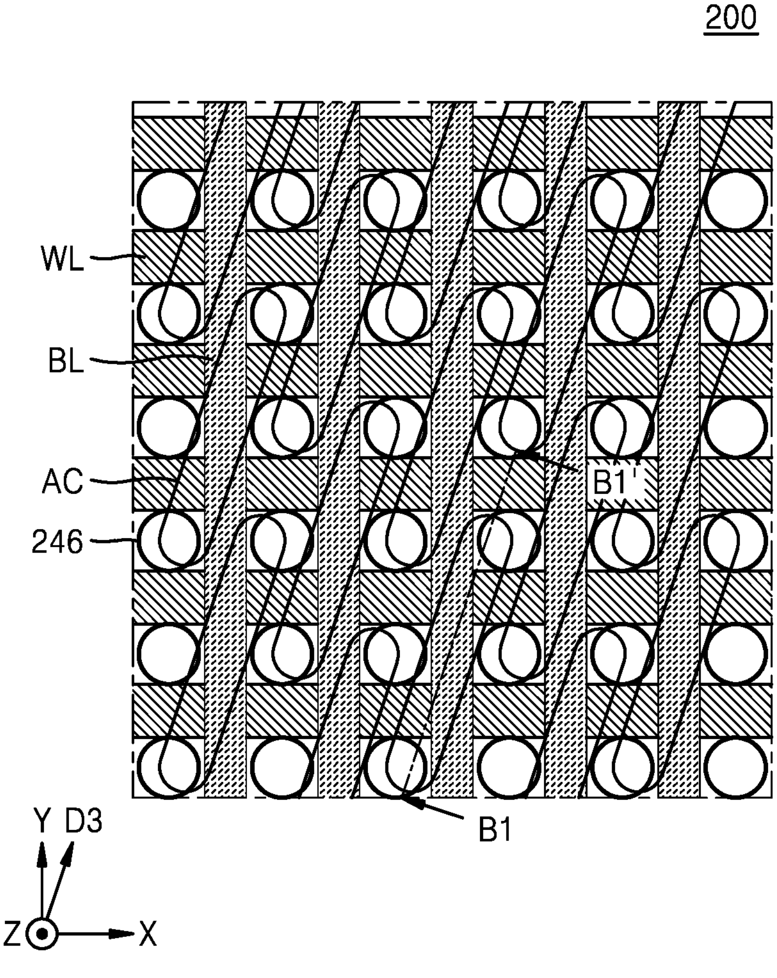
FIG. 14 is a layout view illustrating an integrated circuit device according to embodiments.
Figure 15:
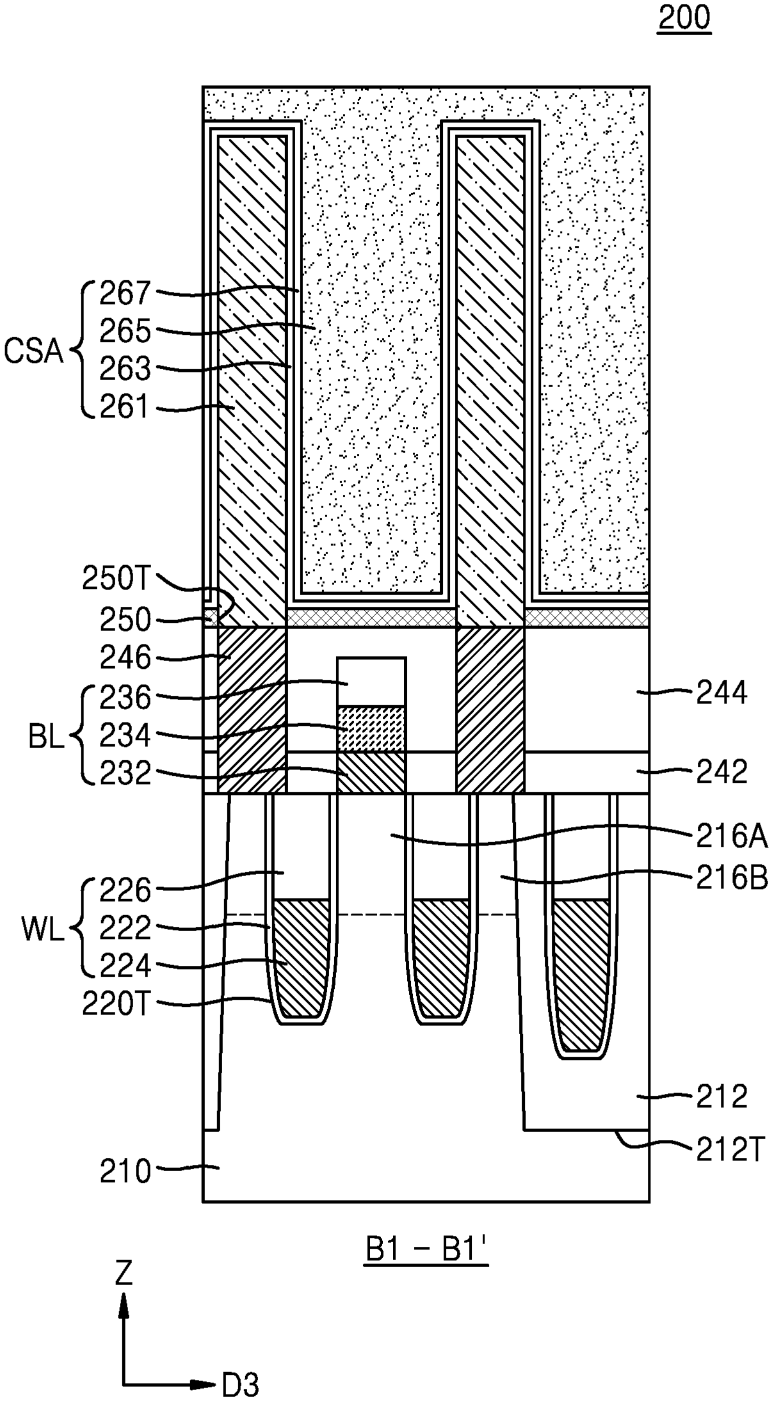
FIG. 15 is a cross-sectional view taken along line B1-B1' of FIG. 14.

FIG. 14 is a layout view illustrating an integrated circuit device 200 according to embodiments. FIG. 15 is a cross-sectional view taken along line B1-B1' of FIG. 14.

Referring to FIGS. 14 and 15, the integrated circuit device 200 may include a capacitor structure CSA on a buried channel array transistor (BCAT) structure.

A substrate 210 may include an active region AC defined by a device isolation layer 212. In some embodiments, the substrate 210 may include a Si wafer.

In some embodiments, the device isolation layer 212 may have an STI structure. For example, the device isolation layer 212 may include an insulation material which is filled into a device isolation trench 212T formed in the substrate 210. The insulation material may include fluoride silicate glass (FSG), undoped silicate glass (USG), boro-phosphosilicate glass (BPSG), phosphosilicate glass (PSG), flowable oxide (FOX), plasma enhanced deposition of tetra-ethyl-ortho-silicate (PE-TEOS), or tonen silazene (TOSZ), but is not limited thereto.

The active region AC may have a relatively long island shape having a short axis and a long axis. As illustrated, the long axis of the active region AC may be arranged in a D3 direction parallel to an upper surface of the substrate 210. In some embodiments, the active region AC may have a first conductive type. The first conductive type may be a p-type (or an n-type).

The substrate 210 may include a word line trench 220T which extends in an X direction. The word line trench 220T may intersect with the active region AC and may be formed by a certain depth from the upper surface of the substrate 210. A portion of the word line trench 220T may extend to an inner portion of the device isolation portion 212, and a portion of the word line trench 220T formed in the device isolation layer 212 may include a bottom surface disposed at a level which is lower than a portion of the word line trench 220T formed in the active region AC.

A first source/drain region 216A and a second source/drain region 216B may be disposed at an upper portion of the active region AC disposed at both or opposing sides of the word line trench 220T. The first source/drain region 216A and the second source/drain region 216B may each be an impurity region doped with impurities having a second conductive type which differs from the first conductive type. The second conductive type may be n-type (or p-type).

A word line WL may be formed in the word line trench 220T. The word line WL may include a gate insulation layer 222, a gate electrode 224, and a gate capping layer 226, which are sequentially formed on an inner wall of the word line trench 220T.

The gate insulation layer 222 may be conformally formed on the inner wall of the word line trench 220T to have a certain thickness. The gate insulation layer 222 may include at least one material selected from among silicon oxide, silicon nitride, silicon oxynitride, oxide/nitride/oxide (ONO), and a high-k dielectric material having a dielectric constant which is greater than that of silicon oxide. For example, the gate insulation layer 222 may have a dielectric constant of about 10 to about 25. In some embodiments, the gate insulation layer 222 may include $HfO_2$, $Al_2O_3$, $HfAlO_3$, $Ta_2O_3$, $TiO_2$, or a combination thereof, but is not limited thereto.

The gate electrode 224 may be formed up to a certain height from a bottom portion of the word line trench 220T to fill the word line trench 220T, on the gate insulation layer 222. The gate electrode 224 may include a work function adjustment layer (not shown) which is disposed on the gate insulation layer 222 and a buried metal layer (not shown) which fills the bottom portion of the word line trench 220T, on the work function adjustment layer. For example, the work function adjustment layer may include at least one of metal such as Ti, TiN, TiAlN, TiAlC, TiAlCN, TiSiCN, Ta, TaN, TaAlN, TaAlCN, and TaSiCN, metal nitride, and metal carbide, and the buried metal layer may include at least one of W, WN, TiN, and TaN.

The gate capping layer 226 may fill a residual portion of the word line trench 220T, on the gate electrode 224. For example, the gate capping layer 226 may include at least one of silicon oxide, silicon oxynitride, and silicon nitride.

A bit line BL extending in a Y direction vertical to an X direction may be formed on the first source/drain region 216A. The bit line BL may include a bit line contact 232, a bit line conductive layer 234, and a bit line capping layer 236, which are sequentially stacked on the substrate 210. For example, the bit line contact 232 may include polysilicon, and the bit line conductive layer 234 may include metal. The bit line capping layer 236 may include an insulation material such as silicon oxynitride or silicon nitride. In the drawing, a bottom surface of the bit line contact 232 is illustrated as having the same level as an upper surface of the substrate 210, but is not limited thereto and may be formed at a level which is lower than the upper surface of the substrate 210.

Optionally, a bit line middle layer (not shown) may be disposed between the bit line contact 232 and the bit line conductive layer 234. The bit line middle layer may include metal silicide such as tungsten silicide or metal nitride such as tungsten nitride. A bit line spacer (not shown) may be further formed on a sidewall of the bit line BL. The bit line spacer may include a single-layer or multi-layer structure which includes an insulation material such as silicon oxide, silicon oxynitride, or silicon nitride. Also, the bit line spacer may further include an air spacer (not shown).

A first interlayer insulation layer 242 may be formed on the substrate 210, and the bit line contact 232 may pass through the first interlayer insulation layer 242 and may be connected to the first source/drain region 216A. The bit line conductive layer 234 and the bit line capping layer 236 may be disposed on the first interlayer insulation layer 242. A second interlayer insulation layer 244 may cover a sidewall of the bit line conductive layer 234 and a side surface and an upper surface of the bit line capping layer 236, on the first interlayer insulation layer 242.

A contact structure 246 may be disposed on the second source/drain region 216B. The first and second interlayer insulation layers 242 and 244 may surround a sidewall of the contact structure 246. In some embodiments, the contact structure 246 may include a lower contact pattern (not shown), a metal silicide layer (not shown), and an upper contact pattern (not shown), which are sequentially stacked on the substrate 210, and a barrier layer (not shown) which surrounds a side surface and a bottom surface of the upper contact pattern. In some embodiments, the lower contact pattern may include polysilicon, and the upper contact pattern may include a metal material. The barrier layer may include a metal nitride having conductivity, that is, a conductive metal nitride.

The capacitor structure CSA may be formed on the second interlayer insulation layer 244. The capacitor structure CSA may correspond to one of the capacitor structures 100, 101, 102, 103, 104, and 105 described above with reference to FIGS. 1 and 3 to 13. An etch stop layer 250 including an opening portion 250T may be formed on the second interlayer insulation 244, and a bottom portion of the lower electrode 261 may be disposed in the opening portion 250T of the etch stop layer 250.

The capacitor structure CSA may include the lower electrode 261 electrically connected to the contact structure 246, a dielectric layer 263 on the lower electrode 261, the upper electrode 265 on the dielectric layer 263, and an interfacial layer 267 disposed between the dielectric layer 263 and the upper electrode 265. The lower electrode 261 may be formed in a pillar shape which extends in a Z direction on the contact structure 246, and the dielectric layer 263 may conformally extend along an upper surface and a sidewall of the lower electrode 261. The upper electrode 265 may be disposed on the dielectric layer 263. The interfacial layer 267 may correspond to one of the interfacial layers 140, 141, 142, 143, 150, and 160 described above with reference to FIGS. 1 and 3 to 13. In FIG. 15, it is illustrated that a work function of a conductive material included in the upper electrode 265 is less than that of a conductive material included in the lower electrode 261 and the interfacial layer 267 is inserted between the upper electrode 265 and the dielectric layer 263. However, according to embodiments, the work function of the conductive material included in the lower electrode 261 may be less than that of the conductive material included in the upper electrode 265, and in this case, the upper electrode 265 may directly contact the dielectric layer 263 and the interfacial layer 267 may be disposed between the lower electrode 261 and the dielectric layer 263. As used herein, when elements or layers have a "direct interface," "directly contact," or are "directly on" one another, no intervening elements or layers are present.

In the drawings, it is illustrated that the capacitor structure CSA is repeatedly arranged in the X direction and the Y direction on the contact structure 246 which is repeatedly arranged in the X direction and the Y direction. However, in further embodiments, unlike the illustration, the capacitor structure CSA may be arranged in a hexagonal shape such as a honeycomb pattern, on the contact structure 246 which is repeatedly arranged in the X direction and the Y direction, and in this case, a landing pad (not shown) may be formed between the contact structure 246 and the capacitor structure CSA.

According to embodiments, an electrical energy barrier between the dielectric layer 263 and an electrode having a relatively low work function may be increased by the interfacial layer 267 inserted between the dielectric layer 263 and an electrode having a relatively low work function, and thus, the capacitor structure CSA may have a symmetrical I-V characteristic. Accordingly, the reliability of the capacitor structure CSA and the reliability of the integrated circuit device 200 including the capacitor CSA may be improved.

Figure 16:
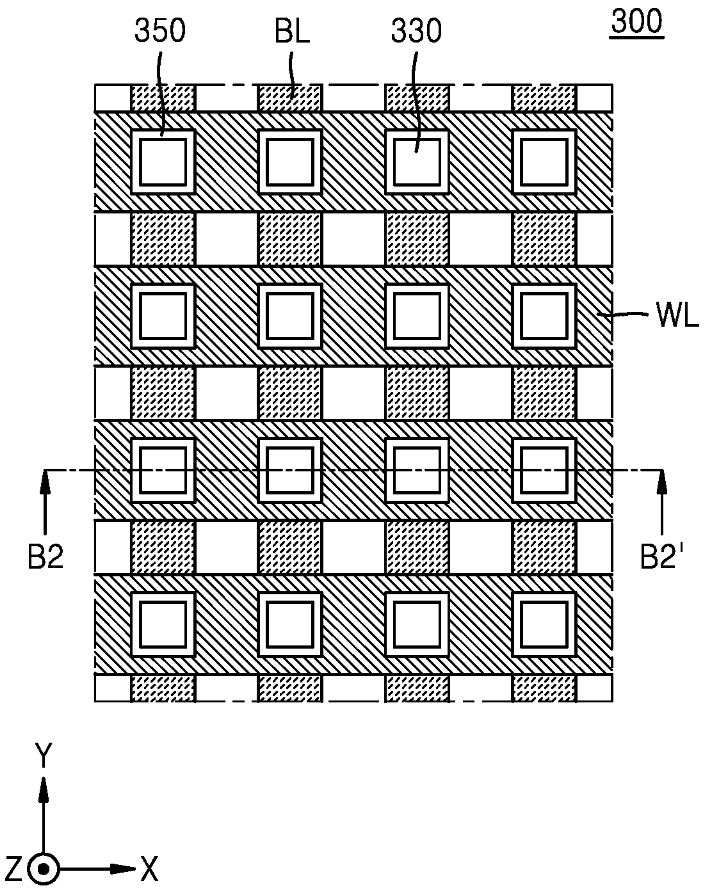
FIG. 16 is a layout view illustrating an integrated circuit device according to embodiments.
Figure 17:
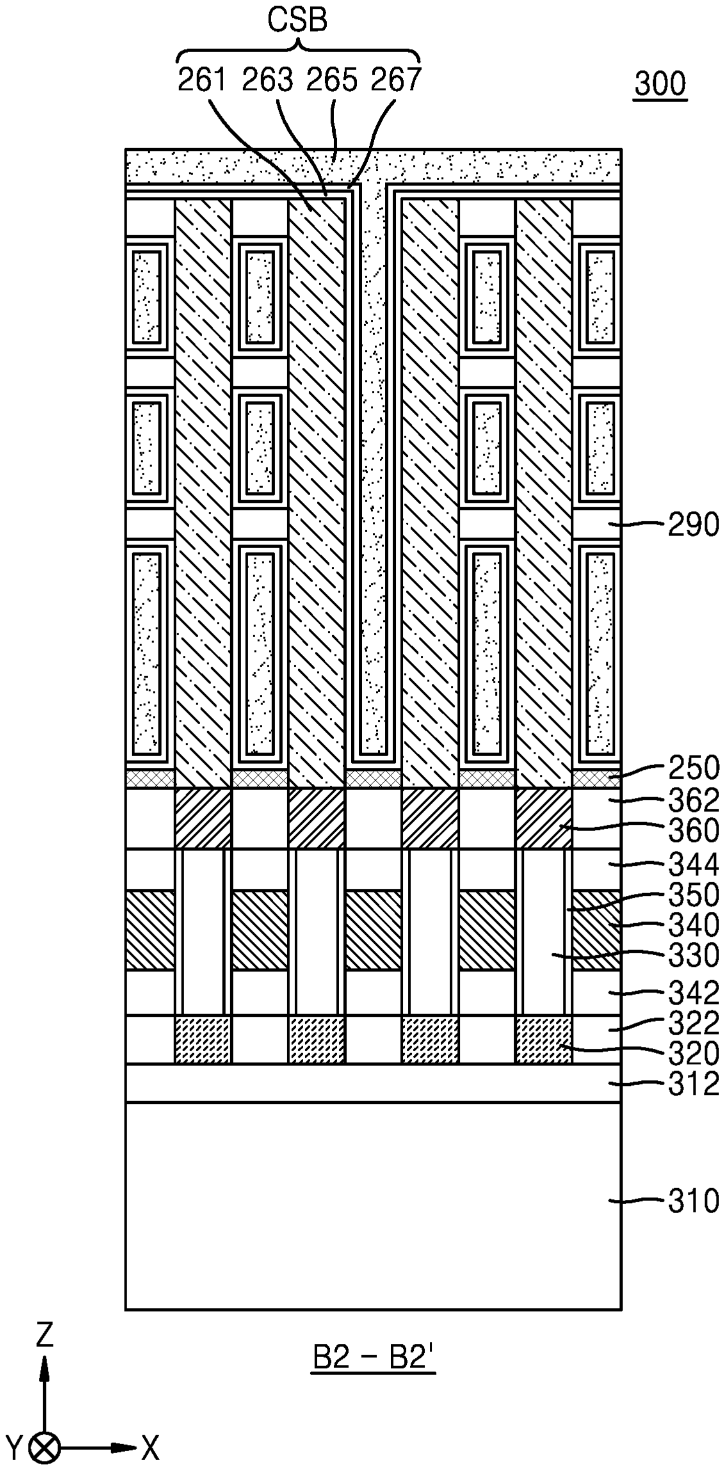
FIG. 17 is a cross-sectional view taken along line B2-B2' of FIG. 16.

FIG. 16 is a layout view illustrating an integrated circuit device 300 according to embodiments. FIG. 17 is a cross-sectional view taken along line B2-B2' of FIG. 16.

Referring to FIGS. 16 and 17, the integrated circuit device 300 may include a capacitor structure CSB on a vertical channel transistor (VCT) structure.

A lower insulation layer 312 may be disposed on a substrate 310, and a plurality of first conductive lines 320 may be spaced apart from one another in an X direction and may extend in a Y direction, on the lower insulation layer 312. A plurality of first insulation patterns 322 may be disposed on the lower insulation layer 312 to fill a space between the plurality of first conductive lines 320. The plurality of first conductive lines 320 may correspond to a bit line BL of the integrated circuit device 300.

In some embodiments, the plurality of first conductive lines 320 may include doped polysilicon, metal, conductive metal nitride, conductive metal silicide, conductive metal oxide, or a combination thereof. For example, the plurality of first conductive lines 320 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO, RuO, or a combination thereof, but are not limited thereto. The plurality of first conductive lines 320 may include a single-layer or multi-layer structure of the material. In some embodiments, the plurality of first conductive lines 320 may include a two-dimensional (2D) semiconductor material, and for example, the 2D semiconductor material may include graphene, carbon nanotube, or a combination thereof.

The channel layer 330 may be arranged in an island shape where channel layers 330 are spaced apart from each other in the X direction and the Y direction, on the plurality of first conductive lines 320. The channel layer 330 may have a channel width in the X direction and a channel height in a Z direction, and the channel height may be greater than the channel width. A bottom portion of the channel layer 330 may function as a first source/drain region (not shown), an upper portion of the channel layer 330 may function as a second source/drain region (not shown), and a portion of the channel layer 330 between the first and second source/drain regions may function as a channel region (not shown). A VCT may represent a structure where a channel length of the channel layer 330 extends in the Z direction from the substrate 310.

In some embodiments, the channel layer 330 may include an oxide semiconductor, and for example, the oxide semiconductor may include $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$, or a combination thereof. The channel layer 330 may include a single-layer or multi-layer structure of the oxide semiconductor. In some embodiments, the channel layer 330 may have band gap energy which is greater than that of silicon. The channel layer 330 may be poly-crystal or amorphous, but is not limited thereto. In some embodiments, the channel layer 330 may include a 2D semiconductor material, and for example, the 2D semiconductor material may include graphene, carbon nanotube, or a combination thereof.

In some embodiments, the gate electrode 340 may surround a sidewall of the channel layer 330 and may extend in the X direction. In the drawing, the gate electrode 340 may be a gate electrode of a gate-all-around type which surrounds a whole sidewall of the channel layer 330. The gate electrode 340 may correspond to a word line WL of the integrated circuit device 300.

In other embodiments, the gate electrode 340 may be a gate electrode of a dual gate type, and for example, may include a first sub gate electrode (not shown) which faces a first sidewall of the channel layer 330 and a second sub gate electrode (not shown) which faces a second sidewall, which is opposite to the first sidewall, of the channel layer 330.

In some other embodiments, the gate electrode 340 may be a gate electrode of a single gate type which covers only the first sidewall of the channel layer 330 and extends in the X direction.

The gate electrode 340 may include doped polysilicon, conductive metal nitride, conductive metal silicide, conductive metal oxide, or a combination thereof. For example, the gate electrode 340 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, but is not limited thereto.

The gate insulation layer 350 may surround the sidewall of the channel layer 330 and may be disposed between the channel layer 330 and the gate electrode 340. In some embodiments, the gate insulation layer 350 may include silicon oxide, silicon oxynitride, a high-k dielectric film having a dielectric constant which is greater than that of silicon oxide, or a combination thereof. The high-k dielectric film may include metal oxide or metal oxynitride. For example, the high-k dielectric film included in the gate insulation layer 350 may include $HfO_2$, HfSiO, HfSiON, HfTaO, HfTiO, HfZrO, $ZrO_2$, $Al_2O_3$, or a combination thereof, but is not limited thereto.

A first buried insulation layer 342 surrounding a lower sidewall of the channel layer 330 may be disposed on the plurality of first insulation patterns 322, and a second buried insulation layer 344 which surrounds the lower sidewall of the channel layer 330 and covers the gate electrode 340 may be disposed on the first buried insulation layer 342.

A capacitor contact 360 may be disposed on the channel layer 330. The capacitor contact 360 may be disposed to vertically overlap the channel layer 330 and may be arranged in a matrix form which is arranged from adjacent capacitor contacts in the X direction and the Y direction. The capacitor contact 360 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO, RuO, or a combination thereof, but is not limited thereto. The upper insulation layer 362 may surround a sidewall of the capacitor contact 360, on the second buried insulation layer 344.

The etch stop layer 250 may be disposed on the upper insulation layer 362, and a capacitor structure CSB may be disposed on the etch stop layer 250. The capacitor structure CSB may correspond to one of the capacitor structures 100, 101, 102, 103, 104, and 105 described above with reference to FIGS. 1 and 3 to 13. The capacitor structure CSB may include a lower electrode 261, a dielectric layer 263, an upper electrode 265, and an interfacial layer 267. The lower electrode 261 may be electrically connected to the capacitor contact 360, the dielectric layer 263 may cover the lower electrode 261, and the upper electrode 265 may cover the lower electrode 261, on the dielectric layer 263. A supporting member 290 may be disposed on a sidewall of the lower electrode 261. The interfacial layer 267 may be disposed between the upper electrode 265 and the dielectric layer 263. The interfacial layer 267 may correspond to one of the interfacial layers 140, 141, 142, 143, 150, and 160 described above with reference to FIGS. 1 and 3 to 13. In FIG. 17, it is illustrated that a work function of a conductive material included in the upper electrode 265 is less than that of a conductive material included in the lower electrode 261 and the interfacial layer 267 is inserted between the upper electrode 265 and the dielectric layer 263. However, according to embodiments, the work function of the conductive material included in the lower electrode 261 may be less than that of the conductive material included in the upper electrode 265, and in this case, the upper electrode 265 may directly contact the dielectric layer 263 and the interfacial layer 267 may be disposed between the lower electrode 261 and the dielectric layer 263.

According to embodiments, an electrical energy barrier between the dielectric layer 263 and an electrode having a relatively low work function may be increased by the interfacial layer 267 inserted between the dielectric layer 263 and an electrode having a relatively low work function, and thus, the capacitor structure CSB may have a substantially symmetrical I-V characteristic. Accordingly, the reliability of the capacitor structure CSB and the reliability of the integrated circuit device 200 including the capacitor CSB may be improved.

While the inventive concept has been particularly shown and described with reference to embodiments thereof, it will be understood that various changes in form and details may be made therein without departing from the scope of the following claims.

What is claimed is:

1. An integrated circuit device comprising:

a transistor on a substrate; and a capacitor structure electrically connected to the transistor, wherein the capacitor structure comprises:

a first electrode including a first conductive material having a first work function;

a dielectric layer on the first electrode, the dielectric layer including a first metal;

a second electrode on the first electrode with the dielectric layer therebetween, the second electrode including a second conductive material having a second work function that is less than the first work function; and an interfacial layer between the dielectric layer and the second electrode, wherein the interfacial layer increases an electrical energy barrier between the second electrode and the dielectric layer relative to that of a direct interface therebetween, and wherein the electrical energy barrier between the second electrode and the dielectric layer is substantially the same as an electrical energy barrier between the first electrode and the dielectric layer.

2. The integrated circuit device of claim 1, wherein the interfacial layer comprises an insulating interfacial layer including a second metal, and a valence of the second metal of the insulating interfacial layer is less than a valence of the first metal of the dielectric layer.

3. The integrated circuit device of claim 2, wherein the second metal of the insulating interfacial layer has a valence of +3 or less, and wherein the first metal of the dielectric layer has a valence of +4.

4. The integrated circuit device of claim 2, wherein a thickness of the insulating interfacial layer is about 5 Å or less in a vertical direction perpendicular to a surface of the second electrode facing the dielectric layer.

5. The integrated circuit device of claim 2, wherein the first metal of the dielectric layer comprises zirconium (Zr), hafnium (Hf), titanium (Ti), or tantalum (Ta), and wherein the second metal of the insulating interfacial layer comprises a rare-earth metal.

6. The integrated circuit device of claim 1, wherein the interfacial layer comprises a first conductive interfacial layer including a third metal, and wherein an electronegativity of the third metal of the first conductive interfacial layer is greater than an electronegativity of the first metal of the dielectric layer.

7. The integrated circuit device of claim 6, wherein a thickness of the first conductive interfacial layer is about 10 Å or less in a vertical direction perpendicular to a surface of the second electrode facing the dielectric layer.

8. The integrated circuit device of claim 6, wherein the first metal of the dielectric layer comprises zirconium (Zr), hafnium (Hf), titanium (Ti), tantalum (Ta), strontium (Sr), barium (Ba), or aluminum (Al), and the third metal of the first conductive interfacial layer comprises chromium (Cr), molybdenum (Mo), tungsten (W), ruthenium (Ru), cobalt (Co), iridium (Ir), nickel (Ni), platinum (Pt), copper (Cu), silver (Ag), gold (Au), or zinc (Zn).

9. The integrated circuit device of claim 1, wherein the dielectric layer comprises a first metal oxide including the first metal, the interfacial layer comprises a second conductive interfacial layer including a second metal oxide, and an oxygen chemical potential of the second metal oxide of the second conductive interfacial layer is greater than an oxygen chemical potential of the first metal oxide of the dielectric layer.

10. The integrated circuit device of claim 9, wherein a thickness of the second conductive interfacial layer is about 10 Å or less in a vertical direction perpendicular to a surface of the second electrode facing the dielectric layer.

11. The integrated circuit device of claim 1, wherein the interfacial layer comprises:

an insulating interfacial layer including a second metal, a valence of the second metal being less than a valence of the first metal of the dielectric layer; and a first conductive interfacial layer including a third metal, an electronegativity of the third metal being greater than an electronegativity of the first metal.

12. The integrated circuit device of claim 1, wherein the dielectric layer includes a first metal oxide comprising the first metal, and wherein the interfacial layer comprises:

an insulating interfacial layer including a second metal, a valence of the second metal being less than a valence of the first metal; and a second conductive interfacial layer including a second metal oxide, an oxygen chemical potential of the second metal oxide being greater than an oxygen chemical potential of the first metal oxide.

13. The integrated circuit device of claim 1, wherein the dielectric layer includes a first metal oxide comprising the first metal, and wherein the interfacial layer comprises:

a first conductive interfacial layer including a third metal, an electronegativity of the third metal being greater than an electronegativity of the first metal; and a second conductive interfacial layer including a second metal oxide, an oxygen chemical potential of the second metal oxide being greater than an oxygen chemical potential of the first metal oxide.

14. The integrated circuit device of claim 1, wherein the interfacial layer comprises:

a first interfacial layer contacting the dielectric layer;

a second interfacial layer spaced apart from the dielectric layer with the first interfacial layer therebetween; and a third interfacial layer between the second interfacial layer and the second electrode, wherein each of the first interfacial layer and the third interfacial layer comprises an insulating interfacial layer including a metal having a valence that is less than a valence of the first metal of the dielectric layer, and wherein the second interfacial layer comprises a conductive interfacial layer including a metal having an electronegativity that is greater than an electronegativity of the first metal of the dielectric layer.

15. The integrated circuit device of claim 1, wherein the interfacial layer comprises:

a first interfacial layer contacting the dielectric layer;

a second interfacial layer spaced apart from the dielectric layer with the first interfacial layer therebetween; and a third interfacial layer between the second interfacial layer and the second electrode, wherein each of the first interfacial layer and the third interfacial layer comprises a conductive interfacial layer including a metal having an electronegativity that is greater than an electronegativity of the first metal of the dielectric layer, and wherein the second interfacial layer comprises an insulating interfacial layer including a metal having a valence that is less than a valence of the first metal of the dielectric layer.

16. The integrated circuit device of claim 1, wherein the dielectric layer includes a first metal oxide comprising the first metal, and wherein the interfacial layer comprises:

a first interfacial layer contacting the dielectric layer;

a second interfacial layer spaced apart from the dielectric layer with the first interfacial layer therebetween; and a third interfacial layer between the second interfacial layer and the second electrode, wherein each of the first interfacial layer and the third interfacial layer comprises an insulating interfacial layer including a metal having a valence that is less than a valence of the first metal, and wherein the second interfacial layer comprises a conductive interfacial layer including a metal oxide having an oxygen chemical potential that is greater than an oxygen chemical potential of the first metal oxide.

17. The integrated circuit device of claim 1, wherein the dielectric layer includes a first metal oxide comprising the first metal, and wherein the interfacial layer comprises:

a first interfacial layer contacting the dielectric layer;

a second interfacial layer spaced apart from the dielectric layer with the first interfacial layer therebetween; and a third interfacial layer between the second interfacial layer and the second electrode, wherein each of the first interfacial layer and the third interfacial layer comprises a conductive interfacial layer including a metal oxide having an oxygen chemical potential that is greater than an oxygen chemical potential of the first metal oxide, and wherein the second interfacial layer comprises an insulating interfacial layer including a metal having a valence that is less than a valence of the first metal.

18. An integrated circuit device comprising:

a transistor on a substrate; and a capacitor structure electrically connected to the transistor, wherein the capacitor structure comprises:

a first electrode including a first conductive material having a first work function;

a dielectric layer on the first electrode, the dielectric layer including a first metal oxide including a first metal;

a second electrode on the first electrode with the dielectric layer therebetween, the second electrode including a second conductive material having a second work function that is less than the first work function; and an interfacial layer between the dielectric layer and the second electrode, wherein the interfacial layer comprises an insulating interfacial layer including a second metal, a first conductive interfacial layer and a second conductive interfacial layer, and wherein a valence of the second metal of the insulating interfacial layer is less than a valence of the first metal of the dielectric layer.

19. The integrated circuit device of claim 18, wherein the interfacial layer further comprises the first conductive interfacial layer including a third metal, and wherein an electronegativity of the third metal of the first conductive interfacial layer is greater than an electronegativity of the first metal of the dielectric layer.

20. An integrated circuit device comprising:

a word line in a word line trench, the word line trench extending in a first direction in a substrate;

a contact structure on the substrate and electrically connected to the word line; and a capacitor structure on the contact structure and electrically connected to the contact structure, wherein the capacitor structure comprises:

a first electrode including a first conductive material having a first work function;

a dielectric layer on the first electrode, the dielectric layer including a first metal oxide including a first metal;

a second electrode on the first electrode with the dielectric layer therebetween and including a second conductive material having a second work function that is less than the first work function; and an interfacial layer between the dielectric layer and the second electrode, wherein the first metal comprises zirconium (Zr), hafnium (Hf), titanium (Ti), or tantalum (Ta), wherein the interfacial layer comprises:

a first insulating interfacial layer including a second metal, a valence of the second metal being less than a valence of the first metal of the dielectric layer; and a first conductive interfacial layer including a third metal, an electronegativity of the third metal being greater than an electronegativity of the first metal of the dielectric layer, and a second insulating interfacial layer including a fourth metal between the first conductive interfacial layer and the second electrode, a valence of the fourth metal being less than a valence of the first metal of the dielectric layer, wherein the first insulating interfacial layer and the first conductive interfacial layer are stacked in a vertical direction perpendicular to a surface of the second electrode, between the dielectric layer and the second electrode, and wherein the interfacial layer increases an electrical energy barrier between the second electrode and the dielectric layer relative to that of a direct interface therebetween.

* * * * *